(12) United States Patent
Nagae et al.

(10) Patent No.: US 7,655,270 B2
(45) Date of Patent: Feb. 2, 2010

(54) DROPLET DISCHARGE METHOD, ELECTRO-OPTICAL DEVICE, AND ELECTRONIC DEVICE

(75) Inventors: Nobuaki Nagae, Chino (JP); Kazumi Aruga, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 721 days.

(21) Appl. No.: 11/442,262

(22) Filed: May 30, 2006

(65) Prior Publication Data
US 2006/0290764 A1 Dec. 28, 2006

(30) Foreign Application Priority Data
Jun. 24, 2005 (JP) ............................. 2005-184456
Apr. 3, 2006 (JP) ............................. 2006-101642

(51) Int. Cl.
*B05D 5/12* (2006.01)
(52) U.S. Cl. ............................. 427/64; 427/8; 427/74; 427/77; 427/256
(58) Field of Classification Search ............ 427/8, 427/64, 74, 77
See application file for complete search history.

(56) References Cited

U.S. PATENT DOCUMENTS 6,939,407 B2 * 9/2005 Kawase et al. .............. 118/680
7,110,066 B2 * 9/2006 Kobayashi .................. 349/106

FOREIGN PATENT DOCUMENTS

| JP | 2001-228321 | 8/2001 |
|----|----|----|
| JP | 2003-021714 | 1/2003 |
| JP | 2003-232912 | 8/2003 |
| JP | 2004-209409 A | 7/2004 |
| JP | 2004-267927 | 9/2004 |
| JP | 2005-013951 A | 1/2005 |

\* cited by examiner

*Primary Examiner*—Brian K Talbot
(74) *Attorney, Agent, or Firm*—Global IP Counselors, LLP

(57) ABSTRACT

A droplet discharge method includes performing a plurality of scans in which a discharge head and a substrate are scanned relative to each other, and discharging droplets of a plurality of types of functional liquid from the discharge head onto a plurality of prescribed portions on the substrate configured and arranged to hold the discharged functional liquid while the discharge head and the substrate are scanned. The performing of the plurality of scans includes performing at least one full discharge scan for each of the prescribed portions so that the functional liquid is discharged over an entire region of each of the prescribed portions, and performing a partial discharge scan so that the functional liquid is discharged so as to avoid at least part of peripheral edges of the prescribed portions.

8 Claims, 14 Drawing Sheets

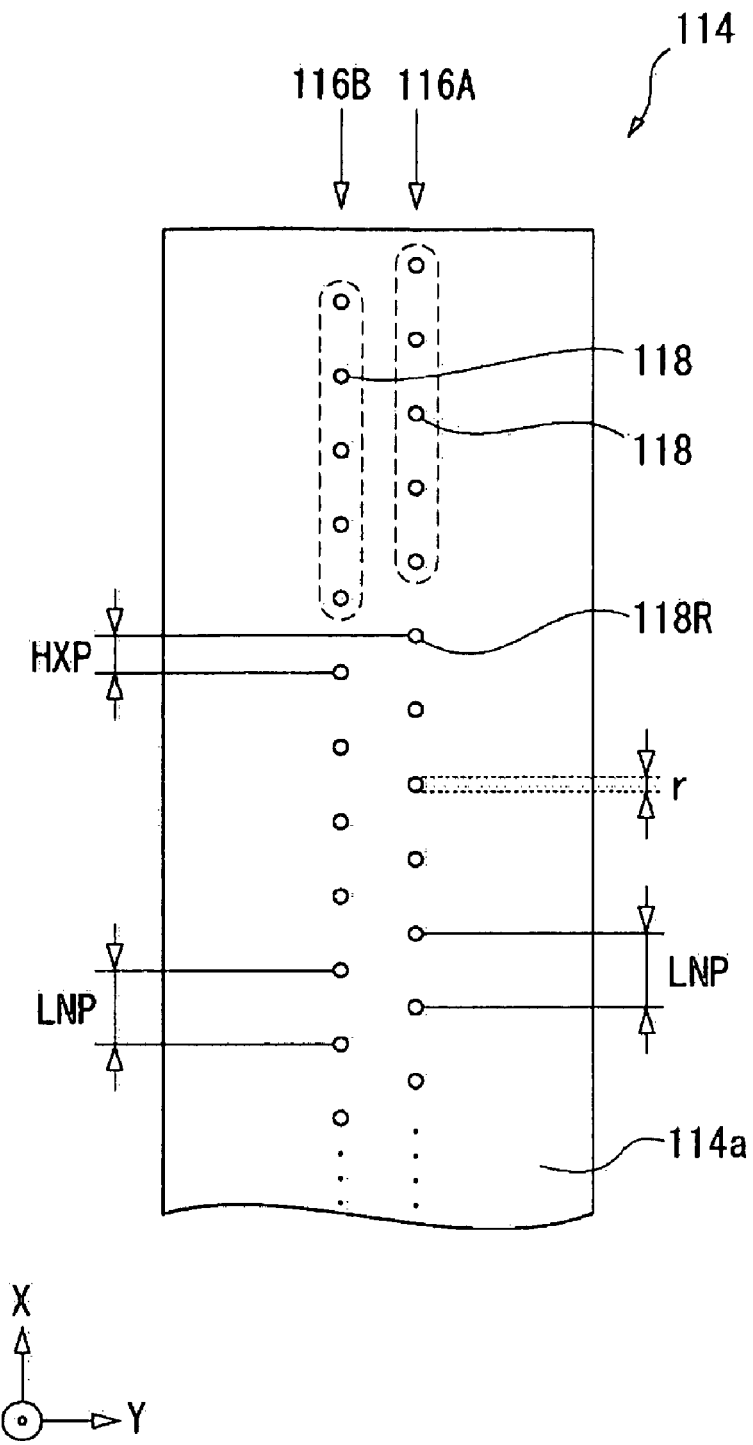
F I G. 5

(a)
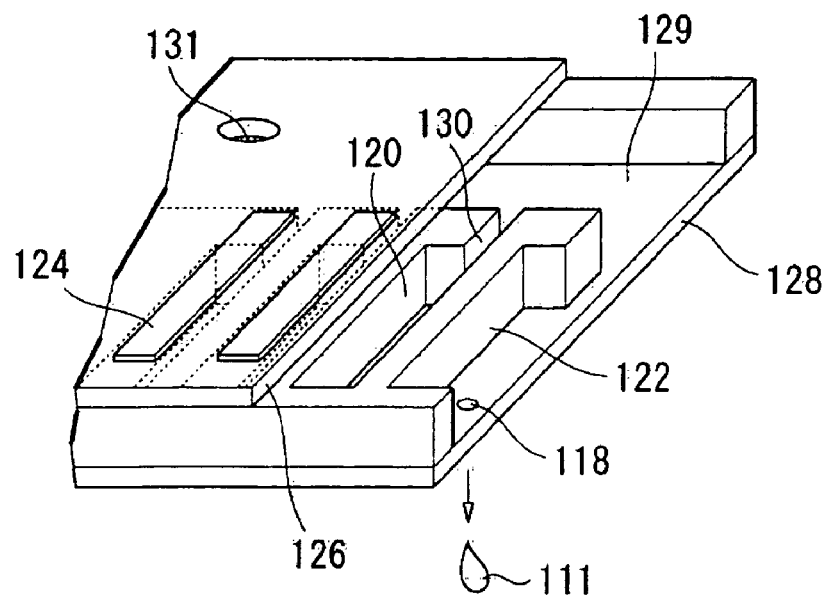
F I G. 6A
(b)
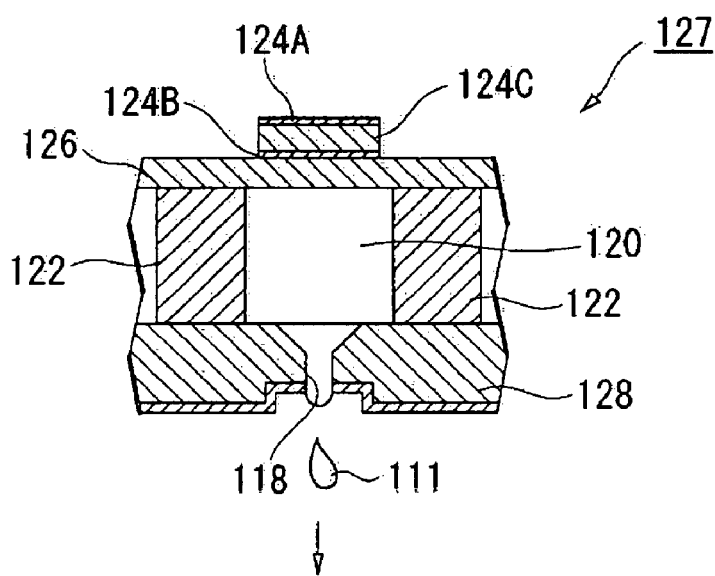
F I G. 6B

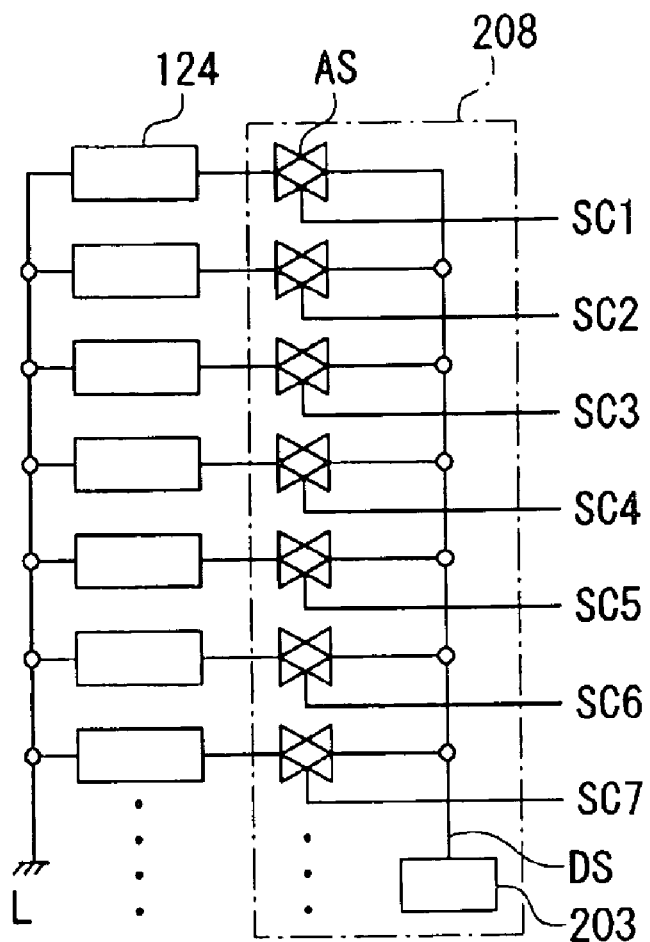
F I G. 8A
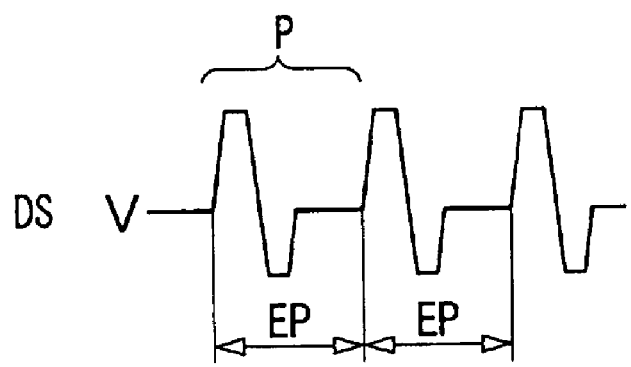
F I G. 8B

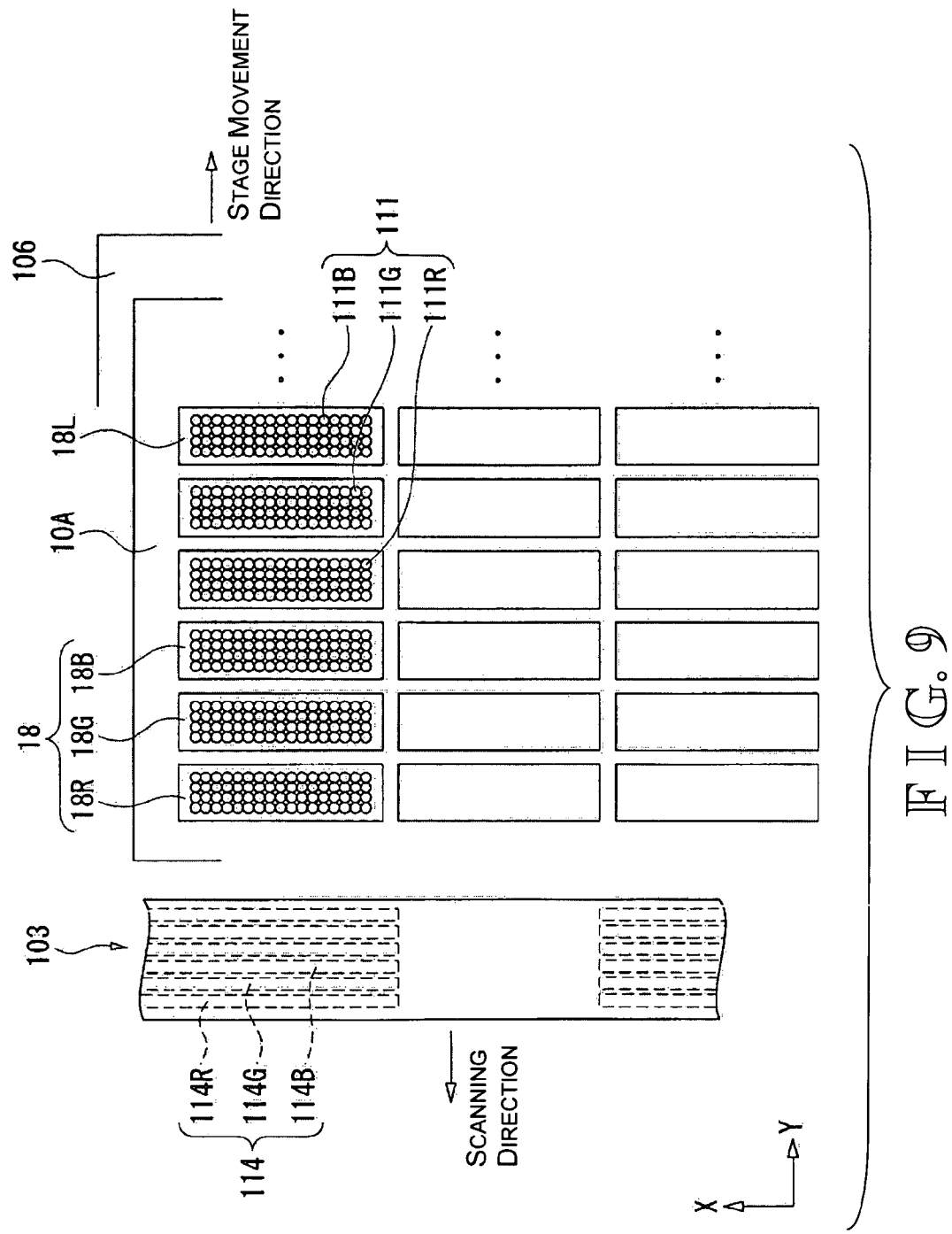

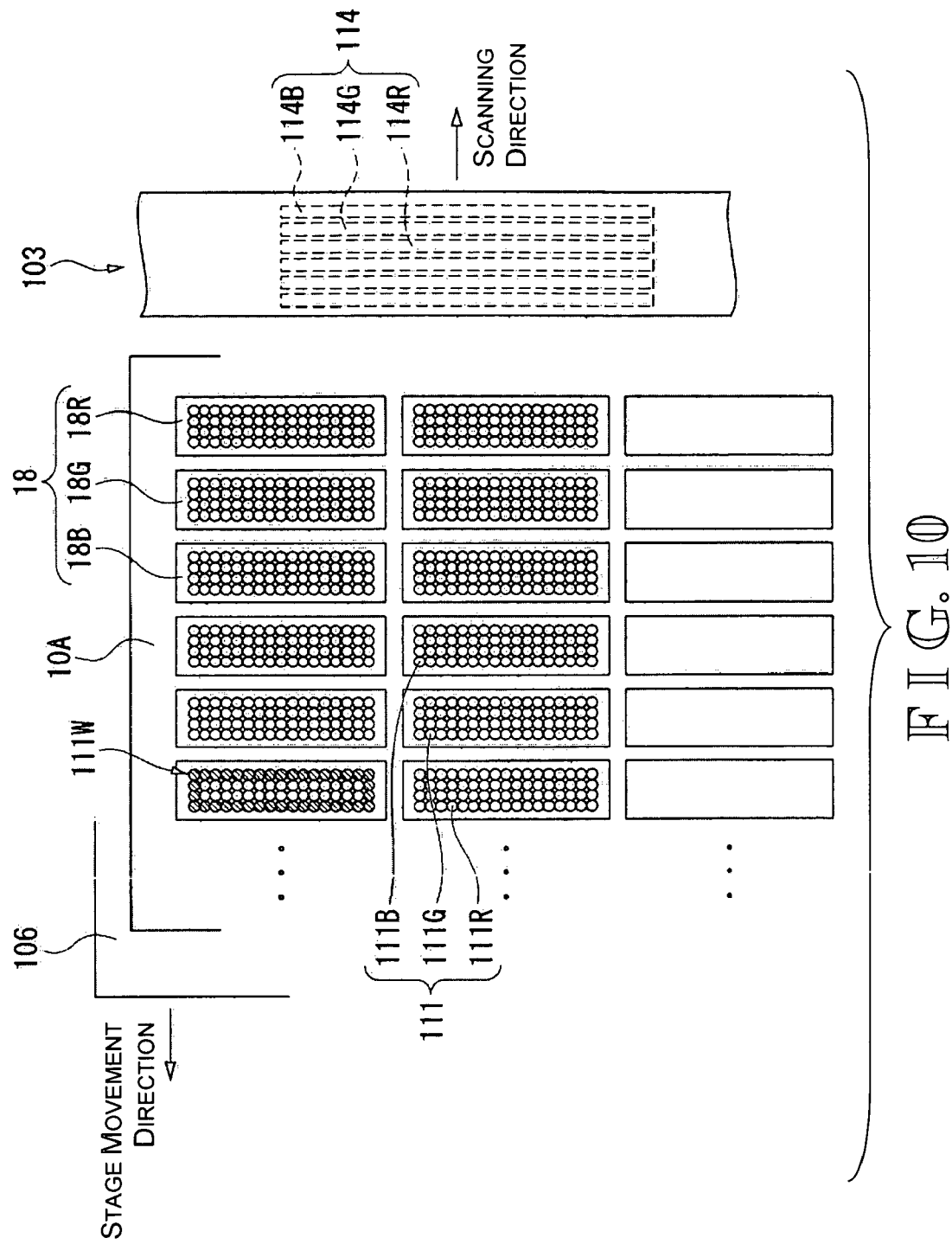

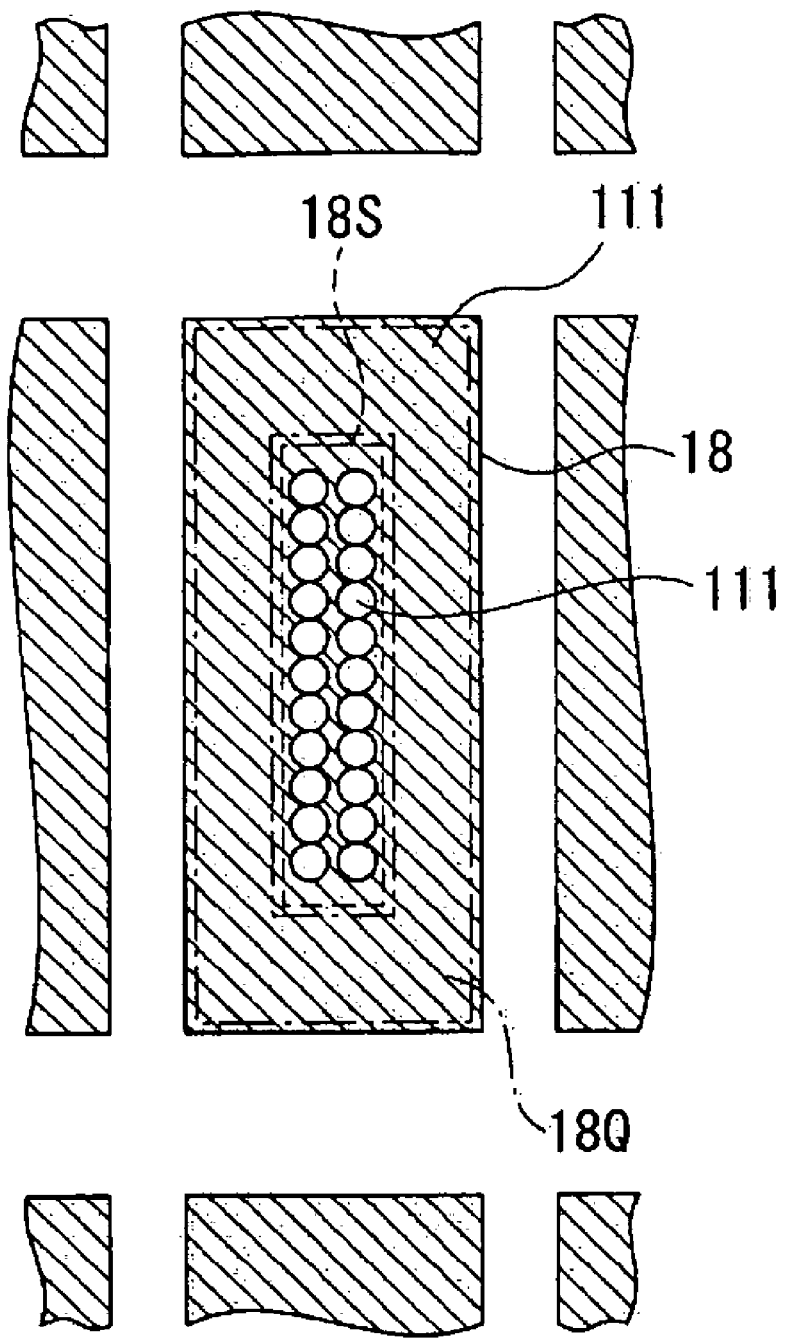
F I G. 13

DROPLET DISCHARGE METHOD, ELECTRO-OPTICAL DEVICE, AND ELECTRONIC DEVICE

CROSS-REFERENCE TO RELATED APPLICATIONS

This application claims priority to Japanese Patent Application Nos. 2005-184456 and 2006-101642. The entire disclosures of Japanese Patent Application Nos. 2005-184456 and 2006-101642 are hereby incorporated herein by reference.

BACKGROUND

1. Technical Field

The present invention relates to a droplet discharge method, an electro-optical device, and an electronic device.

2. Related Art

The droplet discharge head of an inkjet printer is able to discharge microscopic ink droplets in the form of dots, which affords extremely high precision in terms of the uniformity of the size and pitch of the ink droplets. This technology has been applied to the manufacture of many different products, such as electro-optical devices. For instance, it can be applied in the formation of a film for the light-emitting components of organic EL display devices or the color filter layers of liquid crystal devices.

More specifically, a droplet discharge head is filled with a special ink, a photosensitive resin liquid, or another such functional liquid, and droplets of this functional liquid are discharged onto prescribed portions provided on a substrate. Japanese Laid-Open Patent Publication No. 2004-267927 is an example of related art. A number of different colors are usually formed in the light-emitting components or color filters used in conventional electro-optical devices, and a plurality of types of functional liquid are discharged onto the substrate, each by a different device, one at a time.

When the apparatus discussed in the above mentioned reference is used, however, since a plurality of types of functional liquid are discharged onto the substrate by different devices one at a time, the overall discharge process ends up taking a long time. In view of this, the idea was conceived to discharge all types of functional liquid with a single device in order to shorten the discharge time.

Also, the prescribed portions provided to the substrate usually have a larger volume than the droplets of functional liquid, and cannot be fully filled with functional liquid in a single scan, so scanning is performed a number of times. Further, since the prescribed portions have a large bottom surface area compared to the size of the droplets of functional liquid, in each scan the functional liquid is discharged evenly over the entire bottom surface of the prescribed portions so that the functional liquid will not be distributed unevenly within the prescribed portions.

However, as the functional liquid starts to fill the prescribed portions over a plurality of scans, the functional liquid newly discharged toward the prescribed portions can sometimes rebound upon hitting the surface. Particularly around the peripheral edges of the prescribed portions, any functional liquid that rebounds can splash out of the prescribed portions and may become mixed up with another type of functional liquid, such as the functional liquid held in an adjacent prescribed portion. Furthermore, if discharged functional liquid comes into contact with the top of the dividing walls that separate the prescribed portions, the functional liquid may rebound, or the functional liquid adhering to the top part of the walls may flow and become mixed with the functional liquid of another prescribed portion adjacent to the targeted prescribed portion. If functional liquids of different types become mixed in an electro-optical device, this can lead to a decrease in contrast. Also, even if functional liquids of the same type become mixed, the targeted prescribed portions may end up not holding the intended amounts of functional liquid, which causes density unevenness.

In view of the above, it will be apparent to those skilled in the art from this disclosure that there exists a need for an improved droplet discharge method, an improved electro-optical device, and an improved electronic device. This invention addresses this need in the art as well as other needs, which will become apparent to those skilled in the art from this disclosure.

SUMMARY

It is an advantage of the present invention to provide a droplet discharge method, an electro-optical device, and an electronic device, with which there is less unintended mixing of functional liquids, and in particular less mixing of functional liquids of different types.

To achieve the above mentioned object and other objects of the present invention, the droplet discharge method in accordance with a first aspect to the present invention is a droplet discharge method in which a discharge head and a substrate are scanned relative to each other while droplets of a functional liquid are discharged onto the substrate. The discharge head discharges a plurality of types of functional liquid. The substrate is provided with a plurality of prescribed portions for holding the discharged functional liquid. The discharge head and the substrate provided with the prescribed portions are scanned a plurality of times relative to each other, and in the plurality of scans, a full discharge scan, in which the functional liquid is discharged over the entire region of the prescribed portions, is performed at least one time for each of the prescribed portions, and a partial discharge scan is performed, in which the functional liquid is discharged so as to avoid at least part of the peripheral edges of the prescribed portions in scanning other than the full discharge scan.

With this arrangement, since a partial discharge scan is performed in which the functional liquid is discharged so as to avoid at least part of the peripheral edges of the prescribed portions in scanning other than the full discharge scan, droplets of functional liquid are prevented from landing around the peripheral edges of the prescribed portions. This prevents the functional liquid from splashing out from around the peripheral edges of the prescribed portions, and as a result much less of the functional liquid itself is splashed out from the prescribed portions, so there is less mixing of functional liquids of different types. Furthermore, since a full discharge scan is performed at least one time for each of the prescribed portions out of the plurality of scans, there is no uneven distribution of the functional liquid in the prescribed portions, and the functional liquid uniformly wets and spreads out over the entire prescribed portion.

It is preferable that, in the partial discharge scan, the functional liquid is discharged so as to avoid all of the peripheral edges of the prescribed portions.

With this arrangement, since the droplets of functional liquid are discharged so as to avoid all of the peripheral edges of the prescribed portions, even if the functional liquid should rebound upon landing, sufficient distance is ensured around the prescribed portions by these peripheral edges, so there is almost no splashing of the rebounding functional liquid out of the prescribed portions. Thus, there is less mixing of functional liquids of different types.

Also, it is preferable that the full discharge scan is performed at the beginning of all scans.

With this arrangement, because the full discharge scan is performed at the beginning of all scans, the functional liquid uniformly wets and spreads over the entire prescribed portion. This prevents the functional liquid from being unevenly distributed, and allows the thickness of the film that is formed to be uniform.

It is also preferable that the full discharge scan and the partial discharge scan are performed alternately.

With this arrangement, because full discharge scan and the partial discharge scan are performed alternately, the height of the functional liquid levels in the prescribed portions can be kept uniform. This prevents the functional liquid from being unevenly distributed, and allows the thickness of the film that is formed to be uniform.

It is also preferable that an amount of the functional liquid being discharged is reduced as an amount of the functional liquid held in the prescribed portions increases.

With this arrangement, because the amount of functional liquid being discharged is reduced as the amount of functional liquid held in the prescribed portions increases, the force with which the functional liquid lands can be reduced. As a result, rebound itself is reduced during the landing of the functional liquid.

It is also preferable that the scanning includes a step of scanning while the functional liquid is discharged, and a step of scanning while the functional liquid is not discharged, and the scanning speed is lower in the step in which the functional liquid is discharged, than in the step in which the functional liquid is not discharged.

With this arrangement, a large amount of functional liquid can be discharged even in a small area by lowering the scanning speed when the functional liquid is discharged. This increases discharge precision and scanning efficiency.

It is also preferable that the partial discharge scan is performed a plurality of times, and in each partial discharge scan, the droplets are discharged at the same location in each of the prescribed portions.

With this arrangement, control of the position of the discharge head can be facilitated by discharging droplets at the same location in each of the prescribed portions in a partial discharge scan.

It is also preferable that the partial discharge scan discharges to the prescribed portions over the same range as in the full discharge scan or over a range that is farther to the inside than in the full discharge scan.

This reduces rebound of the functional liquid and keeps it from becoming mixed with other functional liquids.

The electro-optical device in accordance with another aspect of the present invention includes the substrate on which the functional liquid has been discharged by the above-mentioned droplet discharge method.

With this arrangement, since the droplets of the functional liquid are discharged by a droplet discharge method with which the undesirable mixing of functional liquids of different types is suppressed, an electro-optical device of high contrast can be obtained, with no mixing of different functional liquids.

The electronic device in accordance with another aspect of the present invention includes the above-mentioned electro-optical device.

With this arrangement, since the electro-optical device of high contrast is installed, the electronic device with excellent display performance can be obtained.

In accordance with another aspect of the present invention, a droplet discharge apparatus is provided that discharges a plurality of functional liquids onto a substrate provided with a plurality of prescribed portions for holding the plurality of functional liquids, while the substrate and a discharge head for discharging the plurality of functional liquids are scanned relative to each other. The droplet discharge apparatus includes a scanning driver with which the substrate and the discharge head are scanned a plurality of times relative to each other, and a head driver with which the discharge of the functional liquids in the plurality of scans is performed so as to avoid the peripheral edges of the prescribed portions in at least one scan.

With this arrangement, since the functional liquid is discharged so as to avoid the peripheral edges of the prescribed portions, droplets of functional liquid are prevented from landing around the peripheral edges of the prescribed portions. This prevents the functional liquid from splashing out of the peripheral edges of the prescribed portions, and as a result much less of the functional liquid itself is splashed out from the prescribed portions, so there is less mixing of functional liquids of different types held by adjacent prescribed portions. Also, even when the functional liquids held in adjacent prescribed portions are of the same type, there will be no increase or decrease in the amounts of functional liquid in the prescribed portions due to splashed functional liquid getting into other prescribed portions.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 5 is a partial plan view of an external structure of a head of the droplet discharge apparatus in accordance with the embodiment of the present invention;

FIG. 6A is a partial perspective view illustrating an internal structure of the head of the droplet discharge apparatus in accordance with the embodiment of the present invention;

FIG. 6B is a partial cross sectional view of the head of the droplet discharge apparatus in accordance with the embodiment of the present invention;

FIG. 8A is a diagram of a head driver of the droplet discharge apparatus in accordance with the embodiment of the present invention;

FIG. 8B is a diagram illustrating a drive signal issued by the head driver in accordance with the embodiment of the present invention;

FIG. 9 is a diagram of a first part of the droplet discharge method in accordance with the embodiment of the present invention;

FIG. 10 is a diagram of a second part of the droplet discharge method in accordance with the embodiment of the present invention;

FIG. 13 is an enlarged partial plan view of the prescribed portions of the color filter substrate after a partial discharge scan is performed in accordance with the embodiment of the present invention.

DESCRIPTION OF EXEMPLARY EMBODIMENTS

Figure 1:
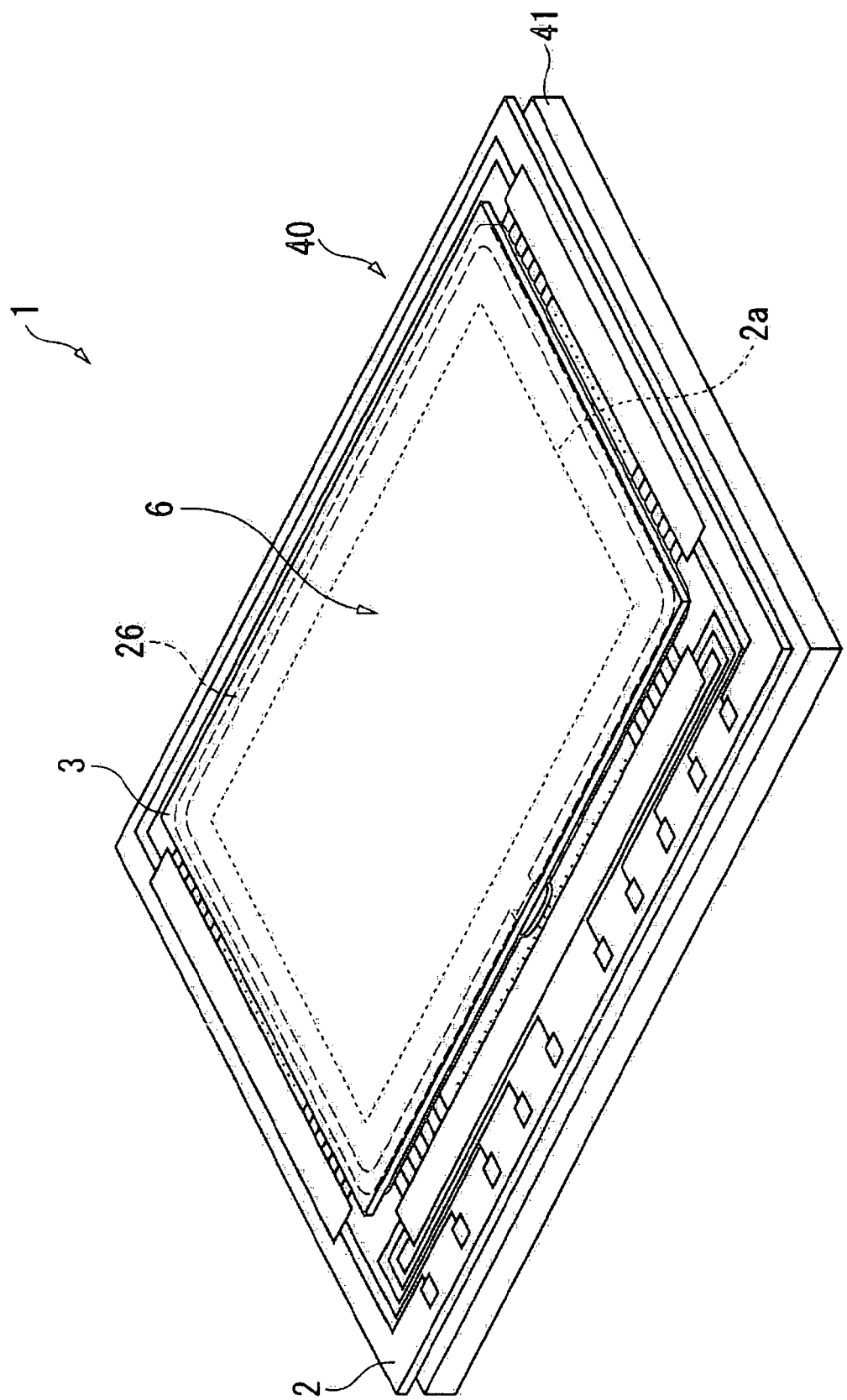
FIG. 1 is a perspective view of a liquid crystal device in accordance with an embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents. In the drawings, the scale is varied as necessary to show each of the members large enough to be recognized.

Electro-Optical Device

FIG. 1 is a perspective view of a liquid crystal device 1 in accordance with this embodiment. As shown in FIG. 1, the liquid crystal device 1 includes a liquid crystal panel 40 and a backlight 41. The liquid crystal panel 40 comprises an active matrix substrate 2 and a color filter substrate 3 that are stuck together with a sealing material 26 therebetween, and liquid crystals are sandwiched between the active matrix substrate 2, the color filter substrate 3, and the sealing material 26. A display area 2a indicated by the dashed line in FIG. 1 is the area where still or moving images or the like are displayed.

The liquid crystal device 1 in this embodiment is an active matrix type of liquid crystal device which makes use of a thin film diode (TFD), which is a two-terminal type of nonlinear element, as a switching element, but of course it may instead, for example, be a liquid crystal device that makes use of a thin film transistor (TFT) as a switching element, or a passive matrix type of liquid crystal device. The liquid crystal panel 40 is formed by putting together two large motherboards and cutting (dicing). The two motherboards are a color filter-side motherboard on which the color filter substrate 3 is produced, and an active matrix-side motherboard on which the active matrix substrate 2 is produced.

Figure 2A:
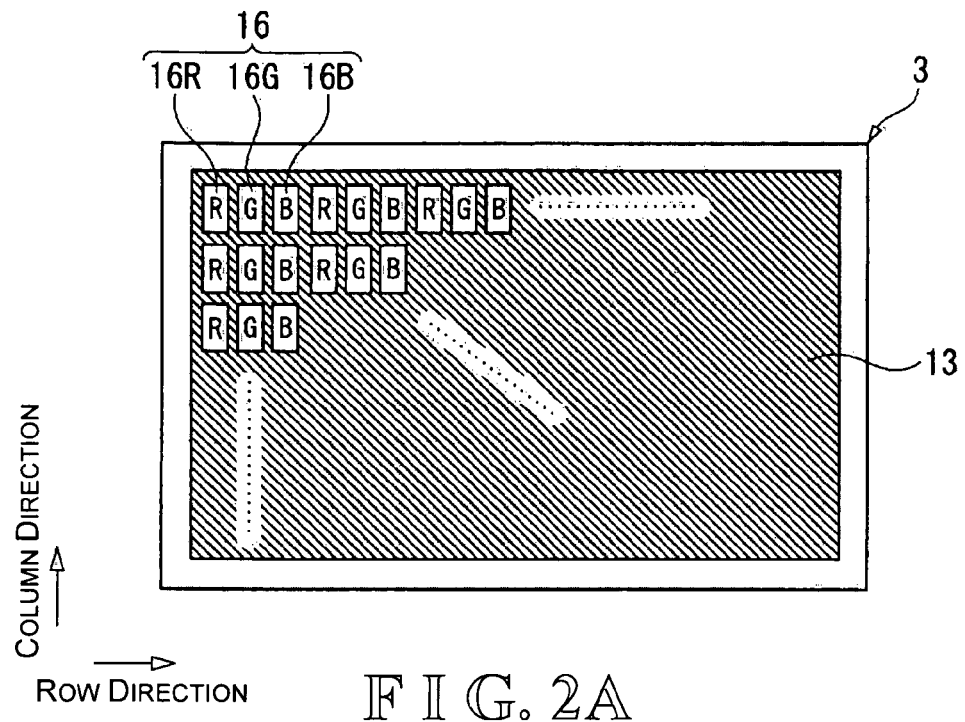
FIG. 2A is a plan view of a color filter substrate in accordance with the embodiment of the present invention.

FIG. 2A is a plan view of the structure of the color filter substrate 3. FIG. 2A is a diagram of the overall structure of the color filter substrate 3, while FIG. 2B is an enlarged detail view of part of the color filter substrate 3.

As shown in FIG. 2A, the color filter substrate 3 is a rectangular substrate formed from a transparent material such as glass or plastic. A light blocking layer 13 is provided over the color filter substrate 3, and a color filter 16 having a red layer 16R, a green layer 16G, and a blue layer 16B, which are pixels corresponding to the regions surrounded by the light blocking layer 13 (pixel regions), is provided in the form of a matrix. In this embodiment, the red layer 16R, green layer 16G, and blue layer 16B of the color filter 16 are formed by inkjet method, and the liquid material is discharged in the pixel regions from a droplet discharge apparatus (discussed below). Therefore, in the following description these pixel regions will be called "prescribed portions."

Also, an overcoat layer (not shown) is formed on the color filter substrate 3 so as to cover the color filter 16 in the regions surrounded by the light blocking layer 13, and an oriented film (not shown) is formed on the overcoat layer. This oriented film is a horizontally oriented film composed of polyimide, for example, whose surface has been lapped.

Figure 2B:
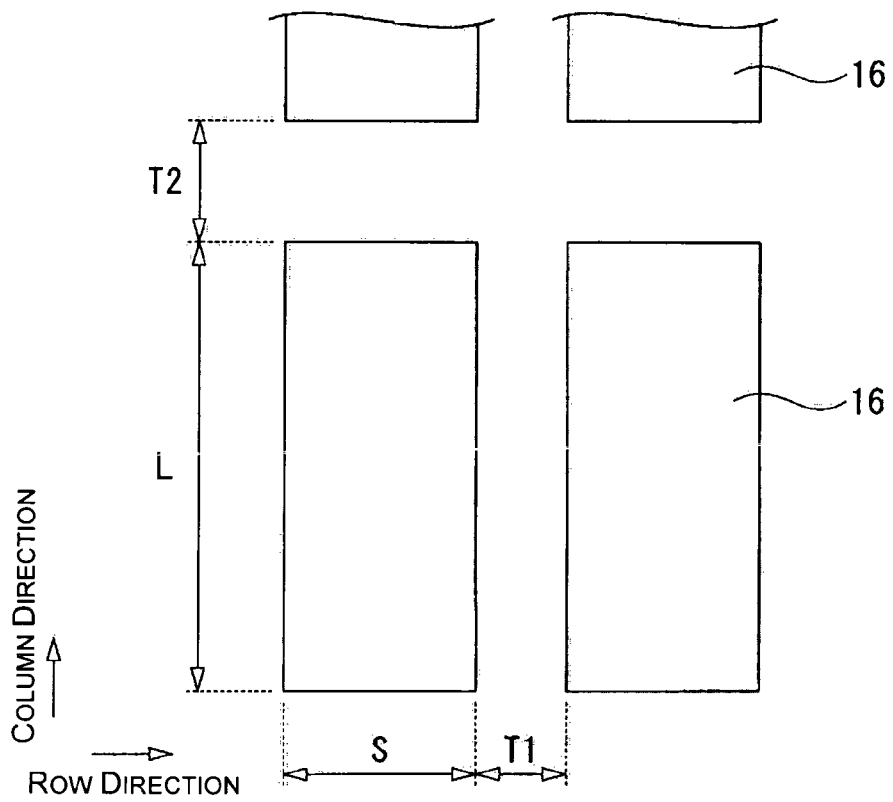
FIG. 2B is an enlarged partial plan view of the color filter substrate in accordance with the embodiment of the present invention.

As shown in FIG. 2B, each one of the red layers 16R (or the green layers 16G or the blue layers 16B) is provided in rectangular form such that the length S of the short side is about 170 μm, for example, and the length L of the long side is about 510 μm, for example. As to the spacing between adjacent color filters 16, the spacing T1 in the row direction is approximately 20 μm, while the spacing T2 in the column direction is approximately 40 μm.

Droplet Discharge Apparatus

Figure 3:
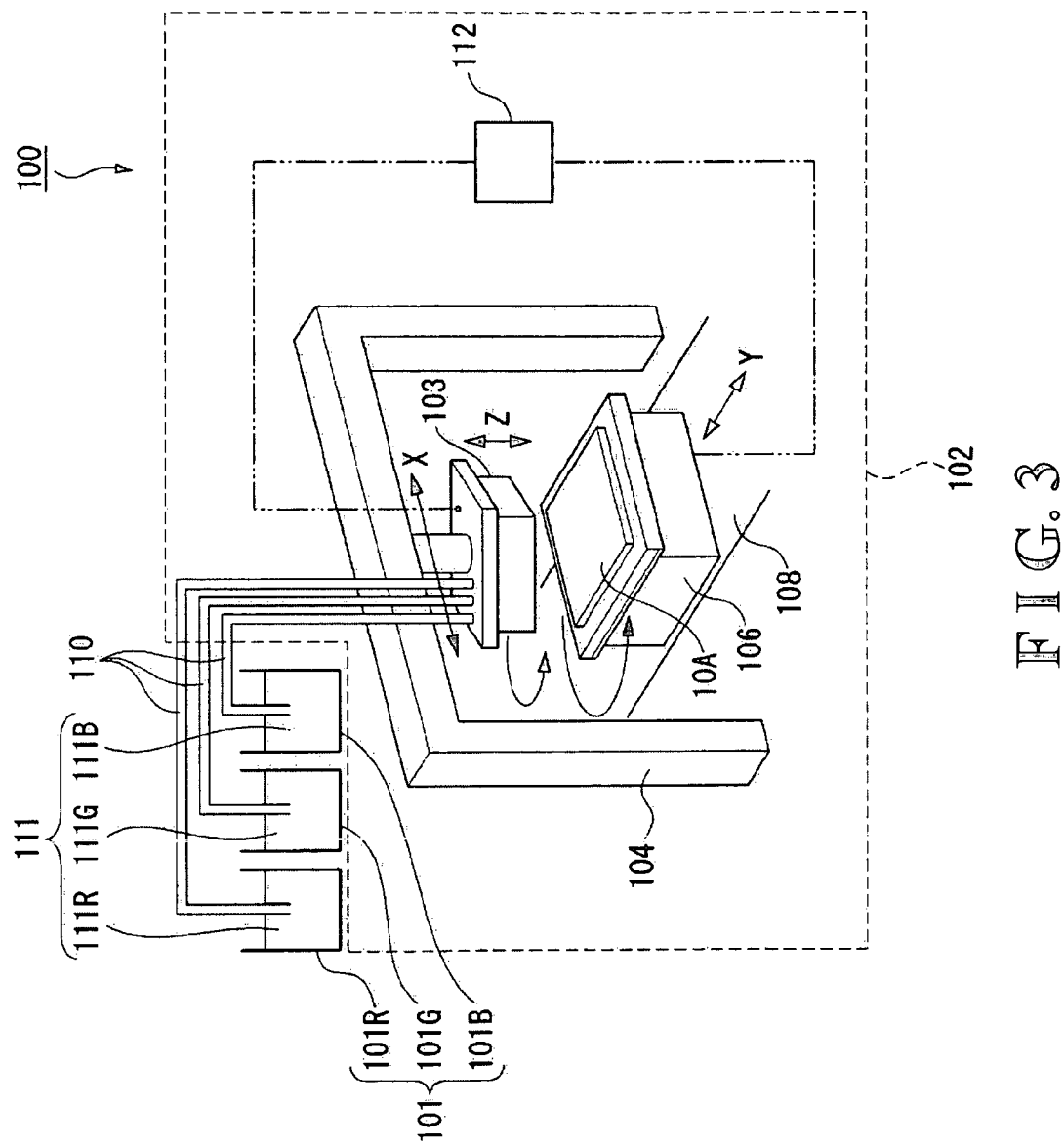
FIG. 3 is a perspective view of an overall structure of a droplet discharge apparatus in accordance with the embodiment of the present invention.

Next, a droplet discharge apparatus (hereinafter referred to as "discharge apparatus") 100 in accordance with this embodiment will be described. As shown in FIG. 3, the discharge apparatus 100 includes a tank 101 that holds a liquid material 111, and a discharge scanning component 102 to which the liquid material 111 is supplied from the tank 101 via a tube 110.

There are three types of the liquid material 111, for example, a material 111R, a material 111G and a material 111B. The material 111R constitutes the red layer 16R of the color filter 16 of the liquid crystal device 1 (hereinafter referred to as "red liquid material"). The material 111G constitutes the green layer 16G (hereinafter referred to as "green liquid material"). The material 111B constitutes the blue layer 16B (hereinafter referred to as "blue liquid material").

The tank 101 has a red material tank 101R for holding the red liquid material 111R, a green material tank 101G for holding the green liquid material 111G, and a blue material tank 101B for holding the blue liquid material 111B, and separately holds the above-mentioned three types of liquid material 111 (111R, 111G, and 111B). A pressure pump (not shown), for example, is attached to each of the tanks 101 (101R, 101G, and 111B). This pressure pump is driven to apply pressure inside the tank 101, which causes the liquid material 111 to be supplied from inside the tank 101 to the discharge scanning component 102.

A solution obtained by dispersing a red inorganic pigment (such as red iron(III) oxide or cadmium red) in a polyurethane oligomer, then adding butylcarbitol acetate as a solvent, adding a nonionic surfactant as a dispersant, and adjusting the viscosity to within the required range, is used as the red liquid material 111R here, for example.

A solution obtained by dispersing a green inorganic pigment (such as chromium oxide green or cobalt green) in a polyurethane oligomer, then adding cyclohexane and butyl acetate as solvents, adding a nonionic surfactant as a dispersant, and adjusting the viscosity to within the required range, is used as the green liquid material 111G here, for example.

A solution obtained by dispersing a blue inorganic pigment (such as ultramarine or Prussian blue) in a polyurethane oligomer, then adding butylcarbitol acetate as a solvent, adding a nonionic surfactant as a dispersant, and adjusting the viscosity to within the required range, is used as the blue liquid material 111B here, for example.

The discharge scanning component 102 has a carriage 103 for holding a plurality of heads 114 (see FIG. 4), a carriage position control device 104 for controlling the position of the carriage 103, a stage 106 for holding a base 10A that constitutes a color filter-side motherboard, a stage position control device 108 for controlling the position of the stage 106, and a controller 112. In actual practice, a plurality of (such as 10) carriages 103 are installed in the discharge apparatus 100. In FIG. 3, however, just one carriage 103 is shown in order to simplify the description.

The carriage position control device 104 is designed to move the carriage 103 in the X or Z axis direction according to signals from the controller 112. The stage position control device 108 is designed to move the stage 106 in the Y axis direction according to signals from the controller 112.

As discussed above, the carriage 103 is designed to move in the X axis direction under the control of the carriage position control device 104. The stage 106, meanwhile, is designed to move in the Y axis direction under the control of the stage position control device 108. In other words, the relative positions of the heads 114 with respect to the stage 106 are varied by the carriage position control device 104 and the stage position control device 108.

Thus, the carriage 103 can be made to scan the stage 106 (or the base 10A held on the stage 106) by moving either the carriage 103 or the stage 106, or both. In this embodiment, a case will be described in which the carriage 103 is held still and scanning is performed by moving the stage 106.

Figure 4:
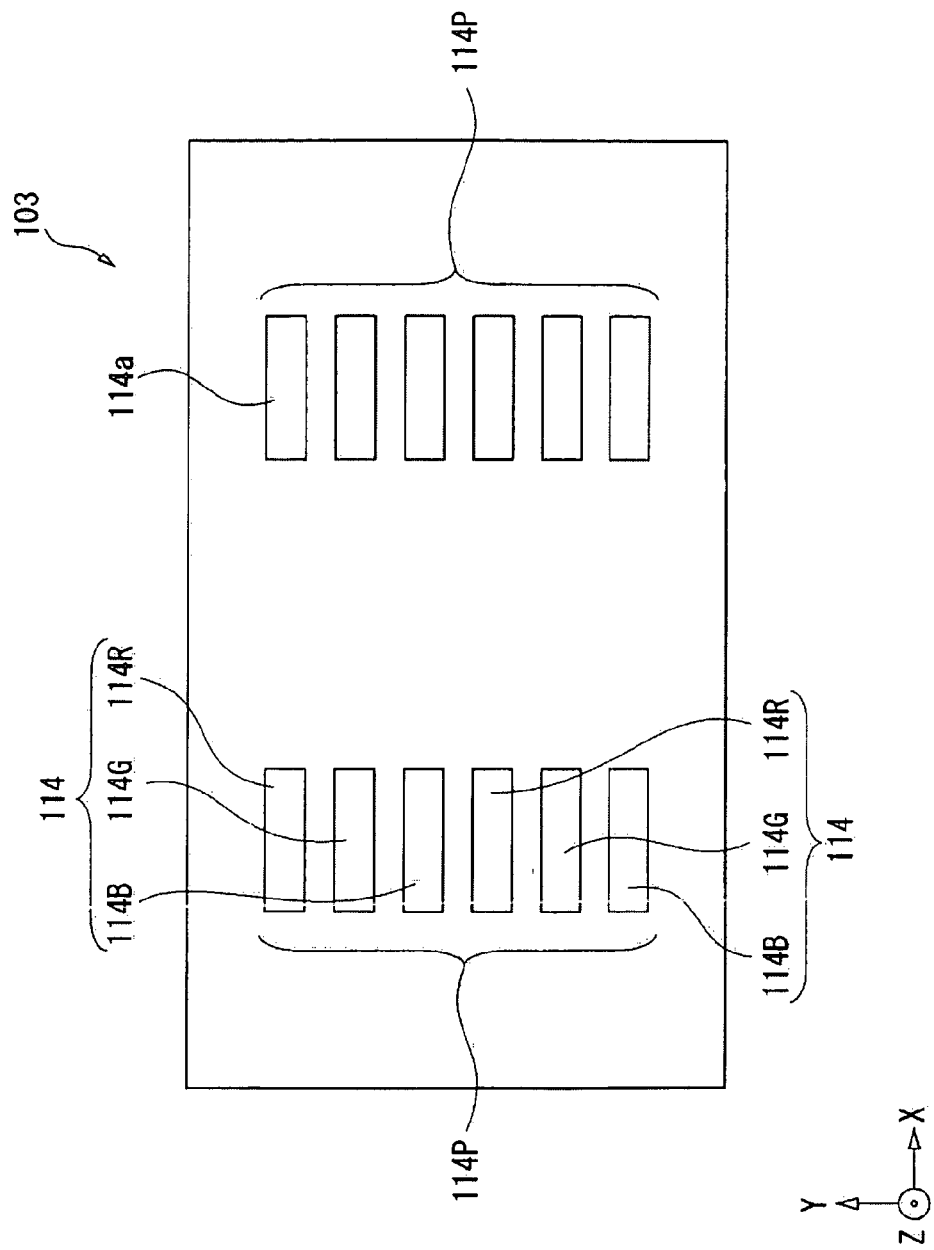
FIG. 4 is a plan view of a structure of a carriage of the droplet discharge apparatus in accordance with the embodiment of the present invention.

FIG. 4 is a view of one carriage 103 from the stage 106 side, and the direction perpendicular to the viewing plane in FIG. 4 is the Z axis direction. The left and right direction in the viewing plane of FIG. 4 is the X axis direction, and the up and down direction is the Y axis direction.

As shown in FIG. 4, the carriage 103 holds a plurality of heads 114 each having substantially the same structure. There are three types of heads 114 which are a head 114R for discharging the red liquid material 111R out of the liquid material 111, a head 114G for discharging the green liquid material 111G out of the liquid material 111, and a head 114B for discharging the blue liquid material 111B out of the liquid material 111.

A head group 114P is provided at two places on the carriage 103. Each head group 114P is provided with two heads 114R, two heads 114G, and two heads 114B, which are provided in a row in the Y axis direction. Therefore, a single carriage 103 is provided with four heads 114R, four heads 114G, and four heads 114B, so a total of 12 heads 114 are provided.

FIG. 5 is a diagram of the bottom surface 114a of a head 114. The shape of the bottom surface 114a is rectangular, having two opposing long sides and two opposing short sides. This bottom surface 114a faces the stage 106 side (in the Z axis direction in the drawing). The long side direction of the head 114 is parallel to the X axis direction in the drawing, and the short side direction of the head 114 is parallel to the Y axis direction in the drawing.

Ninety (for example) nozzles 118 are disposed in two rows (nozzle row 116A and nozzle row 116B) on the bottom surface 114a. The diameter of the nozzles 118 is approximately 30 μm. The nozzles 118 on the nozzle row 116A side and the nozzles 118 on the nozzle row 116B side are disposed at a specific nozzle pitch LNP (LNP is approximately 140 μm) in each row.

The nozzles 118 of the nozzle row 116B are disposed such that they are offset to the positions of the nozzles 118 of the nozzle row 116A by half the length of the nozzle pitch LNP (approximately 70 μm) in the negative direction of the X axis direction (downward in FIG. 5). There need not be two rows of nozzles provided to the head 114. For instance, the number of rows may be increased to three rows, four rows, ... M rows (where M is a natural number), or there may be only one row.

Since the nozzle row 116A and the nozzle row 116B each includes 90 nozzles, 180 nozzles are provided to a single head 114. However, the nozzles up to the fifth one from each end of the nozzle row 116A do not discharge the liquid material 111 (idle nozzles; the portions surrounded with the dashed lines in FIG. 5).

Similarly, the nozzles up to the fifth one from each end of the nozzle row 116B are also idle nozzles that do not discharge liquid material 111 (the portions surrounded with the dashed lines in FIG. 5). Accordingly, only 160 of the 180 nozzles 118 in each head 114 are designed to discharge the liquid material 111 (discharge nozzles), and the 20 nozzles 118 at the ends do not.

In this description of the embodiment, of the 90 nozzles 118 included in the nozzle row 116A, the sixth nozzle 118 from the upper end in the drawing is labeled the "reference nozzle 118R" of the head 114. That is, of the 80 discharge nozzles in the nozzle row 116A, the uppermost discharge nozzle in the drawing is called the "reference nozzle 118R" of the head 114. The position of the reference nozzle 118R need not be the one given above, as long as the reference nozzle 118R is designated in the same way for all of the heads 114.

The structure of the interior of the head 114 will now be described. As shown in FIGS. 6A and 6B, the heads 114 are inkjet heads. More specifically, the heads 114 are each equipped with a diaphragm 126 and a nozzle plate 128. A reservoir 129 that is always filled with the liquid material 111 supplied from the tank 101 through a hole 131 is provided between the diaphragm 126 and the nozzle plate 128.

A plurality of dividing walls 122 are also provided between the diaphragm 126 and the nozzle plate 128. The portion bounded by the diaphragm 126, the nozzle plate 128, and a pair of dividing walls 122 is a cavity 120. A cavity 120 is provided for every nozzle 118, and the number of cavities 120 is the same as the number of nozzles 118. The liquid material 111 is supplied from the reservoir 129, through a supply port 130 provided between a pair of dividing walls 122, to each of the cavities 120.

Oscillators 124 are provided on the diaphragm 126 at positions corresponding to the cavities 120. The oscillators 124 each have a piezo element 124C and a pair of electrodes 124A and 124B that sandwich the piezo element 124C. The liquid material 111 is discharged from the corresponding nozzles 118 by applying drive voltage between the pairs of electrodes 124A and 124B. The shape of the nozzles 118 is adjusted so that liquid material will be discharged in the Z axis direction from the nozzles 118. Electro-thermal conversion elements may be used instead of piezo elements. In other words, the structure may be such that the liquid material 111 is discharged by utilizing the thermal expansion of the material produced by thermal conversion elements.

Figure 7:
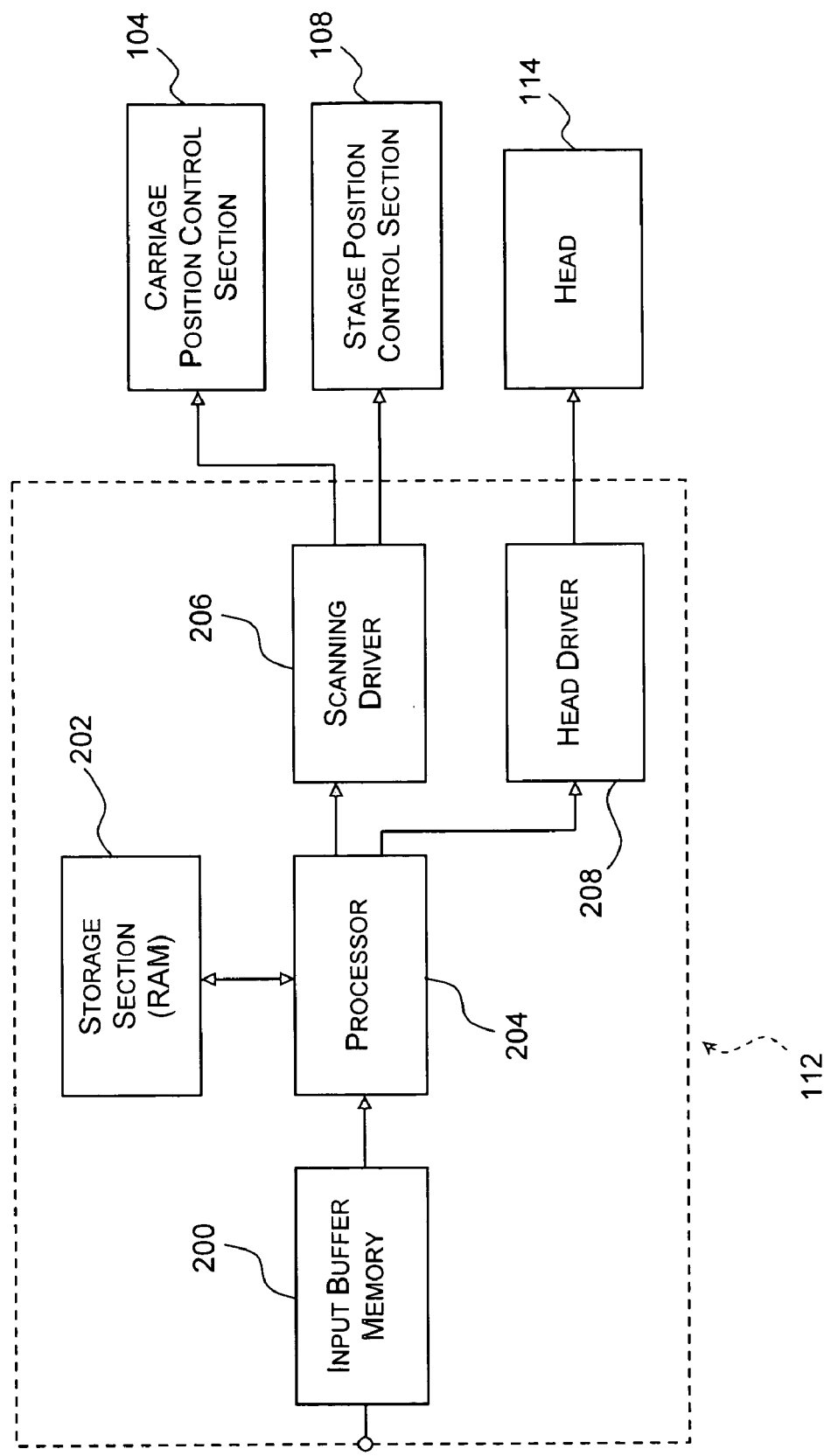
FIG. 7 is a block diagram of a structure of a controller of the droplet discharge apparatus in accordance with the embodiment of the present invention.

The structure of the controller 112 will now be described. FIG. 7 is a block diagram illustrating the structure of the controller 112.

The controller 112 is configured to perform overall control related to the operation of the discharge apparatus 100, such as the timing at which the liquid material 111 is discharged, the position where the carriage 103 is fixed, the movement of the stage 106 (its movement speed, movement distance, etc.), and so forth.

As shown in FIG. 7, the controller 112 is equipped with an input buffer memory 200, a storage section 202, a processor 204, a scanning driver 206, and a head driver 208. The various components are communicably connected.

The input buffer memory 200 receives discharge data for performing the discharge of droplets of the liquid material 111 from an externally connected information processor, for example. The input buffer memory 200 supplies discharge data to the processor 204, and the processor 204 stores the discharge data in the storage section 202. A RAM or the like is used as the storage section 202.

The processor 204 accesses the discharge data stored in the storage section 202, and supplies the necessary drive signal to the scanning driver 206 and the head driver 208 on the basis of this discharge data.

The scanning driver 206 supplies a specific control signal to the carriage position control device 104 and the stage position control device 108 on the basis of this drive signal. The head driver 208 supplies the heads 114 with discharge signals for discharging the liquid material 111 on the basis of the drive signal.

As shown in FIG. 8A, the head driver 208 has one drive signal generator 203 and a plurality of analog switches AS. The analog switches AS are connected to the oscillators 124 inside the heads 114 (more specifically, they are connected to the electrodes 124A, although the electrodes 124A are not shown in FIG. 8A). These analog switches AS are provided corresponding to the nozzles 118, and the number of nozzles 118 is the same as the number of analog switches AS.

The drive signal generator 203 generates a drive signal DS as shown in FIG. 8B. The drive signals DS are supplied independently to the input terminals of the various analog switches AS. The potential of a drive signal DS varies over time versus the reference voltage V. Specifically, the drive signal DS is a signal in which a plurality of discharge waveforms P are repeated at a discharge period EP. The discharge period EP is adjusted to the desired value by the processor 204, for example. Suitably adjusting this discharge period EP allows a discharge signal to be generated so that the liquid material 111 is discharged in the specified order from the plurality of nozzles 118. This allows the timing of the discharge to be controlled.

In addition to the discharge timing, it is also possible to control in conjunction with the scanning driver 206 and the head driver 208. For instance, when the liquid material 111 is to be discharged while the stage 106 is scanned, control can be performed so that the stage 106 will move more slowly during the discharge of the liquid material 111 than when no liquid material 111 is being discharged, that is, so that the scanning speed is lower. Furthermore, whether or not the liquid material 111 is discharged can be controlled by means of the relative positional relationship between the stage 106 and the heads 114 (or the nozzles 118).

The controller 112 can also control the volume of liquid material 111 discharged from the nozzles 118. This control of the volume of liquid material 111 is designed to allow the nozzles 118 to be controlled individually. The volume of liquid material 111 discharged from each nozzle 118 is variable between 0 and 42 pL (picoliters).

The controller 112 may also be a computer that includes a CPU, ROM, and RAM. In this case, the above-mentioned functions of the controller 112 are handled by a software program executed by the computer. The controller 112 may consist of a dedicated circuit (hardware).

Method for Manufacturing Liquid Crystal Device

Droplet Discharge Method

The steps for manufacturing the liquid crystal device 1 constituted as above will now be described. This embodiment will be described using as an example a method in which a plurality of liquid crystal devices are formed all at once using a motherboard with a large surface area, and these are then cut apart into individual liquid crystal devices 1.

First, the step of forming the color filter-side motherboard will be described briefly.

The base 10A is held on the stage 106. A plurality of prescribed portions 18 (18R, 18G, and 18B; see FIG. 9, etc.) that hold the various layers of a color filter are formed on this base 10A. A red layer 16R is held in the prescribed portions 18R, a green layer 16G is held in the prescribed portions 18G, and a blue layer 16B is held in the prescribed portions 18B. When the base 10A is placed on the stage 106, its position is adjusted so that the short side direction of the base 10A coincides with the X axis direction, and the long side direction coincides with the Y axis direction.

In this state, the stage 106 is moved from the left (in FIG. 9) to the right as shown in FIG. 9. The carriage 103 scans over the base 10A from right to left (in FIG. 9), for example. At this time, droplets of liquid material 111 are discharged from the heads 114 over the entire bottom surface 18L of each of the prescribed portions 18 (full discharge scan) while the carriage 103 scans over the base 10A. For instance, on the first scan, as shown in FIG. 9, droplets of the red liquid material 111R, the green liquid material 111G, and the blue liquid material 111B are discharged to the prescribed portions 18 in the uppermost row in the drawing. The droplets of the liquid material 111 may be discharged to any of the rows of the prescribed portions 18, which are provided in a plurality of rows, as desired.

Next, as shown in FIG. 10, the stage 106 is moved from right to left in the drawing. The carriage 103 scans over the base 10A in the opposite direction from that of the first scan, that is, from left to right in the drawing. At this point, droplets of the liquid material 111 are discharged from the heads 114 while the carriage 103 scans the base 10A.

In this scanning, droplets of liquid material 111 are discharged to the prescribed portions 18 to which no liquid material 111 has yet been discharged. For example, as shown in FIG. 10, droplets of the red liquid material 111R, the green liquid material 111G, and the blue liquid material 111B are discharged to the prescribed portions 18 in the second row from the top in the drawing, to which no liquid material 111 was discharged in the first scan. Droplets of liquid material 111 are discharged while selecting those prescribed portions 18 to which no liquid material 111 has been discharged, from among the prescribed portions 18 provided in a plurality of rows, and full discharge scanning is repeated until the liquid material 111 has been discharged into each of the prescribed portions 18 one time.

In discharging the liquid material 111 to the prescribed portions 18, it is inevitable that the liquid material 111 will come into contact with the top of the dividing walls that separate the prescribed portions 18. Consequently, even though it is called full discharge scan, it is necessary to discharge so that the droplet landing center point will be somewhat to the inside of the prescribed portions 18, in plan view, from the dividing walls that separate the prescribed portions, and it is preferable for this discharge to be inside from the dividing walls by at least one half the diameter of the droplets of the discharged liquid material 111. Furthermore, it is best to factor in landing error and so forth and set the discharge range so that the droplets will still not hit the dividing walls separating the prescribed portions.

Figure 11A:
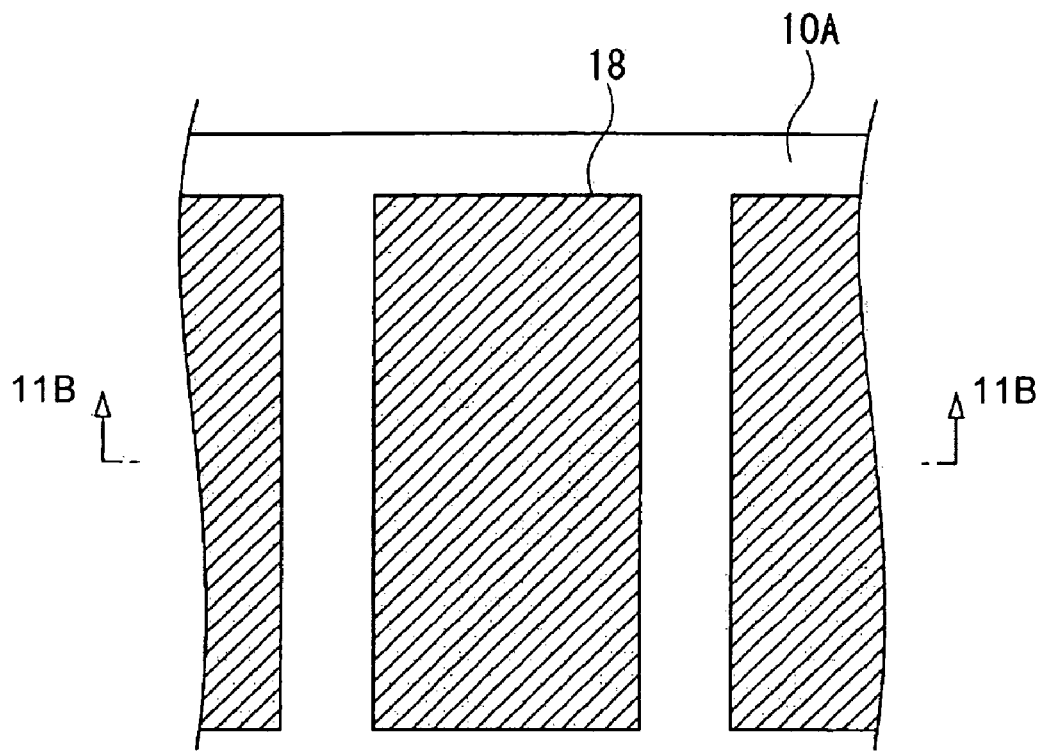
FIG. 11A is a partial enlarged view of prescribed portions of the color filter substrate after a full discharge scan is performed in accordance with the embodiment of the present invention.
Figure 11B:
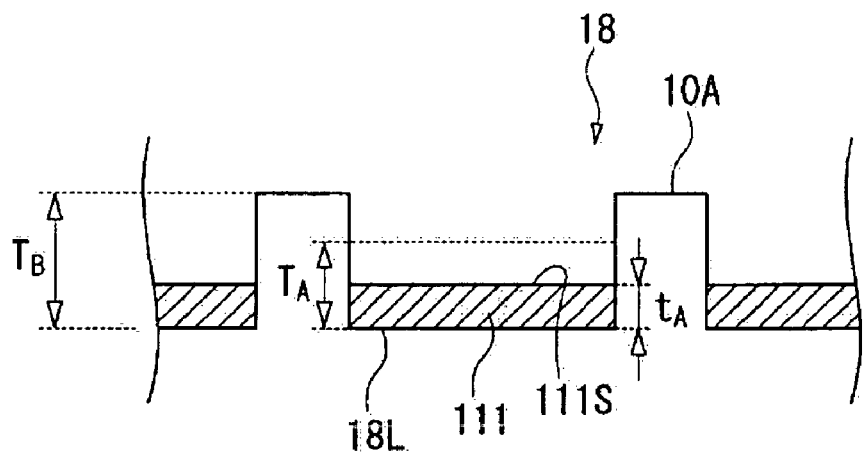
FIG. 11B is a partial cross sectional view of the color filter substrate taken along a section line 11B-11B in FIG. 11A in accordance with the embodiment of the present invention.

FIGS. 11A and 11B are diagrams of the base 10A when the liquid material 1111 has been subjected to full discharge scan in the prescribed portions 18 one time each. FIG. 11A shows a prescribed portion 18 provided to the base 10A, and FIG. 11B is a cross section of this prescribed portion along a section line 11B-11B in FIG. 11A.

In a state in which the liquid materials 111 in the prescribed portions 18 have each undergone full discharge scan one time, the liquid material 111 has been discharged to each entire prescribed portion 18 as shown in FIG. 11A. However, as shown in FIG. 111B, the height $t_A$ from the bottom surface 18L of the prescribed portion 18 up to the surface 111S of the liquid material 111 is lower than the height $T_A$ at which the liquid material 111 is supposed to be held inside the prescribed portions 18. Specifically, this is a state in which the volume of the liquid material 111 is inadequate to form the red layer 16R, the green layer 16G, and the blue layer 16B of the color filter 16.

Therefore, in subsequent scanning, the prescribed portions 18 are scanned such that additional liquid material 111 is discharged so that the height $t_A$ of the liquid surface 111S will substantially coincide with the targeted height $T_A$. The height $T_A$ can be suitably set according to the height $T_B$ of the dividing walls that separate the prescribed portions, and as long as the liquid material 111 does not overflow the prescribed portions 18 due to surface tension or the like, the height $T_A$ may even be greater than the height $T_B$ of the dividing walls that separate the prescribed portions.

Figure 12:
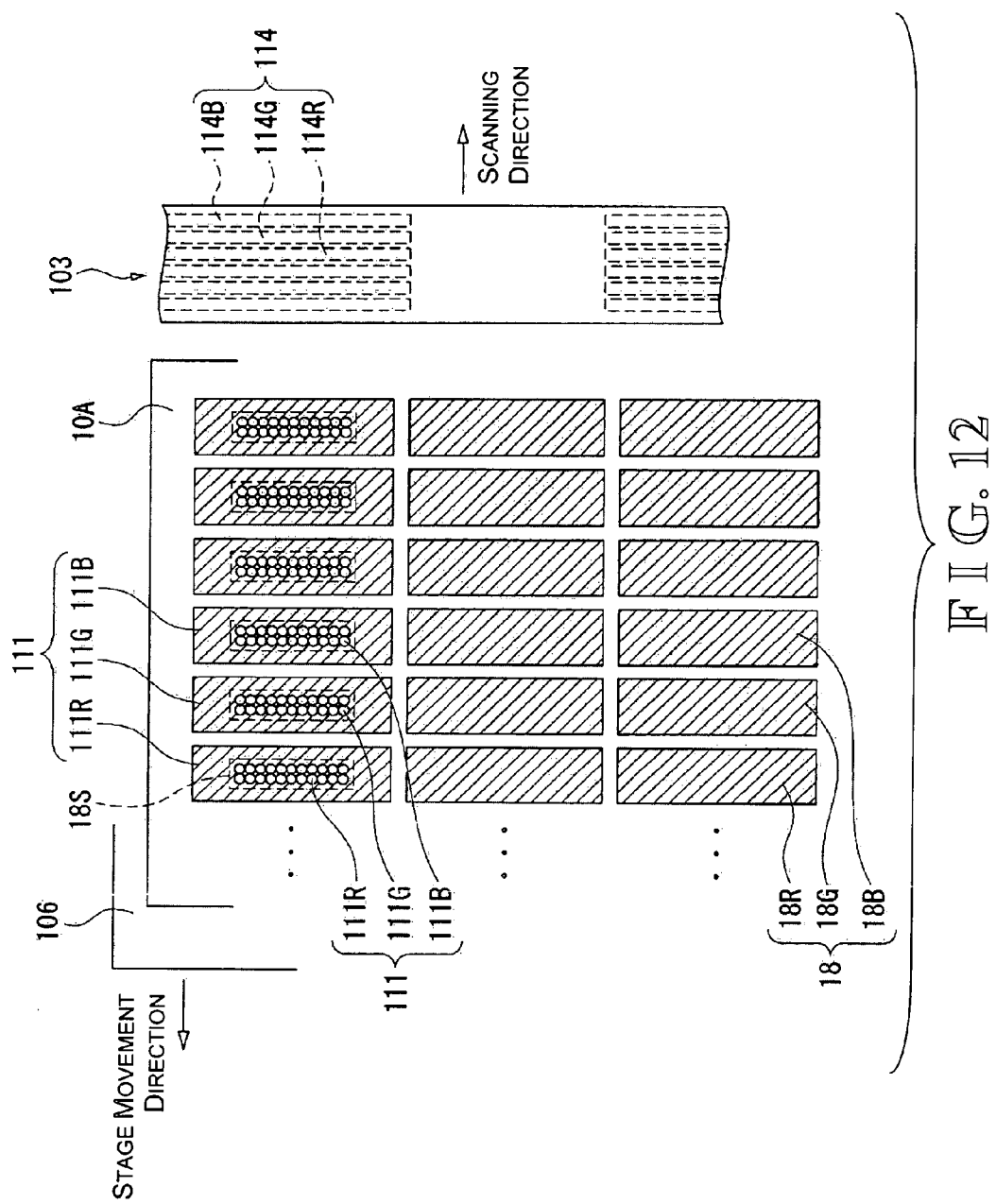
FIG. 12 is a diagram of a third part of the droplet discharge method in accordance with the embodiment of the present invention.

Next, the additional discharge of the liquid material 111 will be described through reference to FIGS. 12 and 13. FIG. 12 is a diagram of how this scanning is performed, and corresponds to FIG. 9 or 10. FIG. 13 shows one of the prescribed portions 18 of the base 10A shown in FIG. 12, and area around this prescribed portion.

When the stage 106 is moved from left to right in the drawing, for instance, the carriage 103 scans the base 10A from right to left. At this point, droplets of the liquid material 111 are discharged from the heads 114 so as to avoid the peripheral edges 18Q (see FIG. 13) of the prescribed portions 18, while the carriage 103 scans over the base 10A (partial discharge scan). This partial discharge scan is designed, for example, so that at least the outermost droplet group 111W of the prescribed portions 18 shown in FIG. 10 (the portion of the droplets of liquid material 111 that is indicated by hatching) is not discharged.

It is preferable that the partial discharge scan discharges farther to the inside than the discharge range of the full discharge scan, when the prescribed portions are viewed in plan view. However, as long as there is no rebound or the like and no mixing with other liquid material, the discharge range of the partial discharge scan may be the same as the discharge range of the full discharge scan. Even if there is some rebound or the like, if the discharge range of the full discharge scan is sufficiently to the inside when the prescribed portion is viewed in plan view, the discharge ranges of the partial discharge scan and full discharge scan can be the same. Moving the discharge range of the partial discharge scan closer to the discharge range of the full discharge scan and being able to discharge over a wider range allows more droplets to be discharged in a single scan, which increases drawing efficiency. Also, the droplets may land in the same position in a plurality of scans. If the droplets land in the same position in each scan, the effect will be that subsequent droplets push and spread out the liquid material that has landed before, so the liquid material can get into the corners of the prescribed portions.

As a result, as shown in FIGS. 12 and 13, for example, droplets of the liquid material 111 are discharged to the center parts 18S so as to avoid the peripheral edges 18Q of the prescribed portions 18. The portion where no droplets are discharged may be expanded beyond just the outermost droplet group 111W, such as a droplet group from the outermost periphery to the second peripheral row, or a droplet group from the outermost periphery to the third peripheral row.

In this embodiment, the spacing in the left and right direction in the drawings is set smaller than the spacing in the up and down direction in the drawings, and the droplets of liquid material 111 are discharged so as to avoid the peripheral edges 18Q, and particularly the peripheral edges in the left and right direction in the drawings, since this is where rebounding droplets of liquid material 111 are most likely to mix together. Therefore, droplets of the red liquid material 111R, the green liquid material 111G, and the blue liquid material 111B are discharged to the center parts 18S of the prescribed portions 18 in the uppermost row in the drawings.

Also, in this partial discharge scan, just as in the full discharge scan, the droplets of the liquid material 111 may be discharged to any of the rows of the prescribed portions 18, which are provided in a plurality of rows, as desired. As to the scanning speed in the scanning of the carriage 103 over the base 10A, the scanning speed when the liquid material 111 is discharged from the heads 114 is set to be lower than the scanning speed when no liquid material is discharged.

This partial discharge scan is performed until the height $t_A$ from the bottom surface 18L of the prescribed portions 18 up to the surface 111S of the liquid material 111 substantially coincides with the targeted height $T_A$, that is, until reaching a state in which the prescribed portions 18 are filled with liquid material 111 in a volume sufficient to form the red layer 16R, green layer 16G, and blue layer 16B of the color filter 16.

The subsequent steps will now be described briefly. Electrodes, wiring, and so forth (not shown) are formed on the base 10A on which the color filter 16 was formed, and a smoothing film is formed. A dividing wall or spacer (not shown) for gap control is formed on the surface of the base 10A. An oriented film is formed so as to cover the color filter or wiring formed on this base 10A, and this oriented film is lapped. The oriented film can be formed, for example, by coating or printing with a polyimide. A sealing material composed of an epoxy resin or the like is formed in a rectangular shape, and the region surrounded by the sealing material is coated with liquid crystals.

Next, in the formation of the motherboard on the active matrix side, wiring, electrodes, and so forth are formed on a large substrate composed of a transparent material such as glass or plastic, and a smoothing film is formed on the region where the wiring, electrodes, and so forth have been formed. Once the smoothing film is formed, an oriented film composed of polyimide or the like is formed, and this oriented film is lapped.

The motherboard on the color filter side and the motherboard on the active matrix side are then stuck together in the form of panels. With the two substrates close together, the motherboard on the active matrix side is bonded to the sealing material on the motherboard on the color filter side. After this, scribe lines are made on the bonded motherboards, the panels are cut along these scribe lines, the cut panels are washed, and drivers and so forth are mounted on the panels. A polarizer is affixed to the outer surface of each liquid crystal panel, and the backlight 41 is attached to complete the liquid crystal device 1.

Thus, with this embodiment, in scanning other than full discharge scan, partial discharge scan is performed in which the liquid material 111 is discharged so as to avoid the peripheral edges 18Q of the prescribed portions 18, which prevents the droplets of liquid material 111 from landing on the peripheral edges 18Q of the prescribed portions 18. This prevents the liquid material 111 from splashing out from the peripheral edges 18Q of the prescribed portions 18, and as a result much less of the functional liquid 111 itself is splashed out from the prescribed portions 18, so there is less mixing of the red liquid material 111R, green liquid material 111G, and blue liquid material 111B. Furthermore, since a full discharge scan is performed at least one time for each of the prescribed portions 18 out of the plurality of scans, there is no uneven distribution of the liquid material 111 in the prescribed portions 18, and the liquid material 111 uniformly wets and spreads out over the entire prescribed portions 18, without being unevenly distributed.

Also, because the full discharge scan is at the beginning of all scans, the liquid material 111 that is subsequently discharged to the prescribed portions 18 tends to uniformly wet and spread over the entire prescribed portions 18. This allows the resulting film to be formed in a uniform thickness.

Furthermore, as the volume of the liquid material 111 held in the prescribed portions 18 increases, the amount of liquid material 111 discharged is gradually decreased, so the rebound that occurs when the discharged liquid material 111 lands is itself suppressed.

In addition, when the liquid material 111 is discharged during scanning, the scanning speed is lower than that when no liquid material 111 is discharged, a large amount of liquid material 111 can be discharged even in a small area. This increases discharge precision and scanning efficiency.

Also, it is preferable to discharge the liquid material 111 at the same position in the prescribed portions 18 in partial discharge scanning a plurality of times. If the liquid material 111 is discharged in the same position in the prescribed portions 18 in partial discharge scan, it is easier to control the head position.

Electronic Device

Next, the electronic device in accordance with the present invention will be described, using a mobile telephone as an example.

Figure 14:
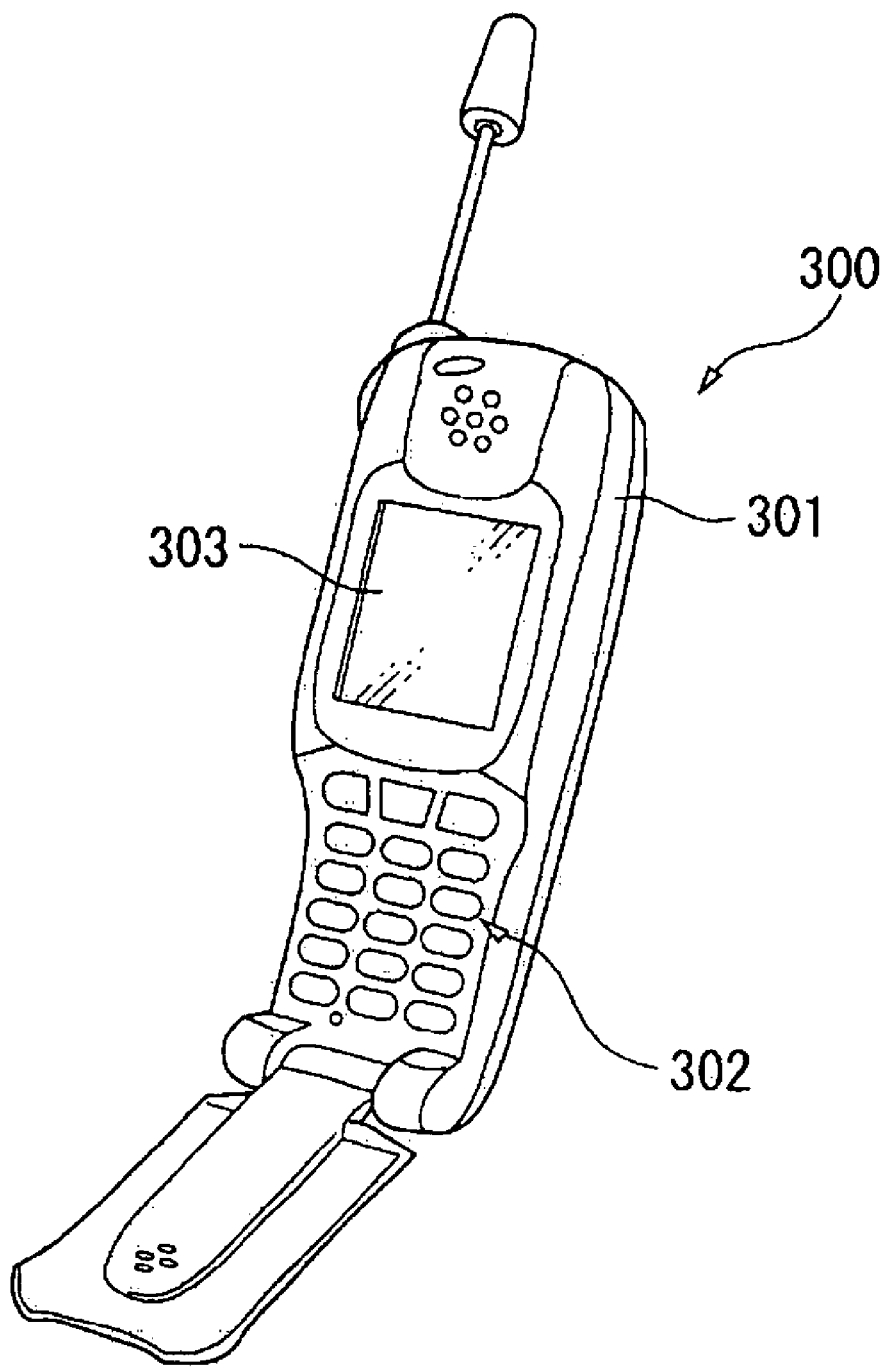
FIG. 14 is a perspective view of a structure of an electronic device in accordance with the embodiment of the present invention.

FIG. 14 is a perspective view of the overall structure of a mobile telephone 300.

The mobile telephone 300 has a housing 301, a control pad 302 provided with a plurality of control buttons, and a display component 303 for displaying still or moving images, text, or the like. The liquid crystal device 1 of the present invention is installed in the display component 303.

Because the liquid crystal device 1 installed here affords high contrast and quality, an electronic device (the mobile telephone 300) with superior display performance can be obtained.

The technological scope of the present invention is not limited to the above embodiments, and modifications can be made as desired to the extent that the gist of the present invention is not exceeded.

For instance, forming the color filter 16 on the color filter substrate 3 of the liquid crystal device 1 was given above as an example of the present invention, but the present invention is not limited to this, and can also be applied to the formation of an organic layer (such as a light emitting layer) on a substrate for an organic EL device.

Also, full discharge scan, in which the liquid material 111 is discharged to the entire prescribed portion 18, and partial discharge scan, in which the liquid material 111 is discharged to the center part 18S of the prescribed portion 18, may be performed alternately. Alternating these scans allows the liquid material 111 held in the prescribed portions 18 to be discharged in a uniform thickness. This allows the red layer 16R, green layer 16G, and blue layer 16B of the color filter 16 to be formed in a uniform thickness.

Also, in the above embodiments, the controller 112 was able to control the volume of the liquid material 111 discharged from the nozzles 118, and an example of this is controlling the amount of discharge (volume) of the liquid material 111 according to the volume of the liquid material 111 held in the prescribed portions 18.

More specifically, the constitution may be such that the discharge amount is gradually reduced as the volume of the liquid material 111 held in the prescribed portions 18 increases. This reduces the force with which the functional liquid lands, so rebound itself is reduced during the landing of the liquid material 111.

General Interpretation of Terms

In understanding the scope of the present invention, the term "configured" as used herein to describe a component, section or part of a device includes hardware and/or software that is constructed and/or programmed to carry out the desired function. In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. As used herein to describe the present invention, the following directional terms "forward, rearward, above, downward, vertical, horizontal, below and transverse" as well as any other similar directional terms refer to those directions of an electro optical device, a droplet discharge apparatus, or an electronic device equipped with the present invention. Accordingly, these terms, as utilized to describe the present invention should be interpreted relative to an electro optical device, a droplet discharge apparatus, or an electronic device equipped with the present invention as used in the normal riding position. Finally, terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents.

What is claimed is:

1. A droplet discharge method comprising:

performing a plurality of scans in which a discharge head and a substrate are scanned relative to each other; and discharging droplets of a plurality of types of functional liquid from the discharge head onto a plurality of prescribed portions on the substrate configured and arranged to hold the discharged functional liquid while the discharge head and the substrate are scanned, the performing of the plurality of scans including performing at least one full discharge scan for each of the prescribed portions so that the functional liquid is discharged over an entire region of each of the prescribed portions, and performing a partial discharge scan so that the functional liquid is discharged so as to avoid at least part of peripheral edges of the prescribed portions.

2. The droplet discharge method as recited in claim 1, wherein the performing of the partial discharge scan includes discharging the functional liquid to avoid all of the peripheral edges of the prescribed portions.

3. The droplet discharge method as recited in claim 1, wherein the performing of the at least one full discharge scan for each of the prescribed portions is conducted at the beginning of all scans.

4. The droplet discharge method as recited in claim 1, wherein the performing of the plurality of scans includes performing the full discharge scan and the partial discharge scan alternately.

5. The droplet discharge method as recited in claim 1, wherein the discharging of the droplets includes reducing an amount of the functional liquid being discharged as an amount of the discharged functional liquid held in the prescribed portions increases.

6. The droplet discharge method as recited in claim 1, wherein the performing of the plurality of scans includes scanning while the functional liquid is discharged and scanning while the functional liquid is not discharged, a scanning speed in the scanning in which the functional liquid is discharged being lower than a scanning speed in the scanning in which the functional liquid is not discharged.

7. The droplet discharge method as recited in claim 1, wherein the performing of the partial discharge scan includes performing the partial discharge scan for a plurality of times and discharging the droplets at the same locations in each of the prescribed portions in each of the partial discharge scans.

8. The droplet discharge method as recited in claim 1, wherein the performing of the partial discharge scan includes discharging the droplets to each of the prescribed portions over a range that is equal to or farther to the inside than a range to which the droplets are discharged during the full discharge scan.

* * * * *